Figure 1:
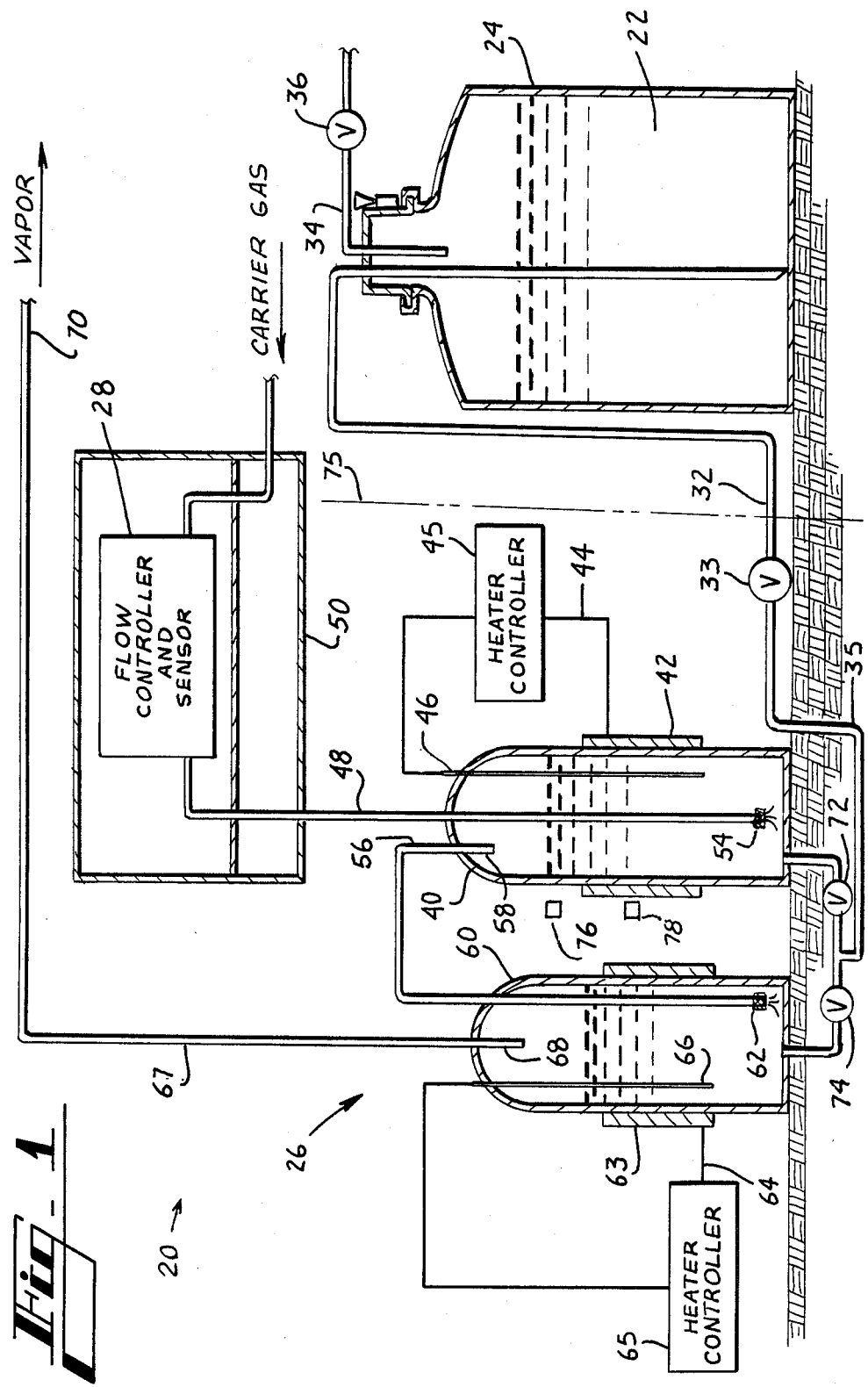

United States Patent [19]

Lynch et al.

[11] Patent Number: 4,582,480
[45] Date of Patent: Apr. 15, 1986

[54] METHODS OF AND APPARATUS FOR VAPOR DELIVERY CONTROL IN OPTICAL PREFORM MANUFACTURE

[75] Inventors: Brian Lynch; Pundi L. Narasimham, both of Norcross; Fred P. Partus, Marietta, all of Ga.

[73] Assignee: AT&T Technologies, Inc., Berkeley Heights, N.J.

[21] Appl. No.: 637,246

[22] Filed: Aug. 2, 1984

[51] Int. Cl.[4] .......................................... F27D 23/00; F27B 17/00; F22B 1/28; B01D 47/02
[52] U.S. Cl. ...................................... 432/1; 219/271; 261/22; 261/125; 432/266
[58] Field of Search ...................... 432/1, 266; 261/22, 261/124, 125; 219/271, 272, 275

[56] References Cited

U.S. PATENT DOCUMENTS

| | | | |
|---|---|---|---|
| 3,826,560 | 7/1974 | Schultz | 350/96 |
| 4,140,735 | 2/1979 | Schumacher | 261/22 |
| 4,217,027 | 8/1980 | MacChesney | 350/96 |
| 4,235,829 | 11/1980 | Partus | 261/121 R |
| 4,276,243 | 7/1981 | Partus | 261/128 |
| 4,408,116 | 10/1983 | Turner | 219/275 |

Primary Examiner—John J. Camby
Attorney, Agent, or Firm—F. W. Somers

[57] ABSTRACT

A vapor delivery system for the manufacture of an optical preform includes a deposition bubbler (60) and another bubbler (40) referred to as a supply bubbler which is interposed between a reservoir (24) of a liquid and the deposition bubbler. Heat energy is applied to the supply bubbler and to the deposition bubbler to vaporize liquid therein. A carrier gas is introduced into the liquid in the supply bubbler at a location below the free surface and into the deposition bubbler to cause vapor of the liquid to become entrained in the carrier gas and to flow from the supply bubbler into the deposition bubbler and from the deposition bubbler to a substrate tube from which an optical preform is made. Facilities are provided for maintaining sufficient liquid in the supply bubbler and suitable temperatures of the liquid in the supply and deposition bubblers to control the vapor flow into and out of the deposition bubbler to prevent unintended perturbations in the deposition bubbler. As a result, the concentration level of the vapor which is entrained in the carrier gas and delivered to the substrate tube is maintained at a substantially constant value.

16 Claims, 2 Drawing Figures

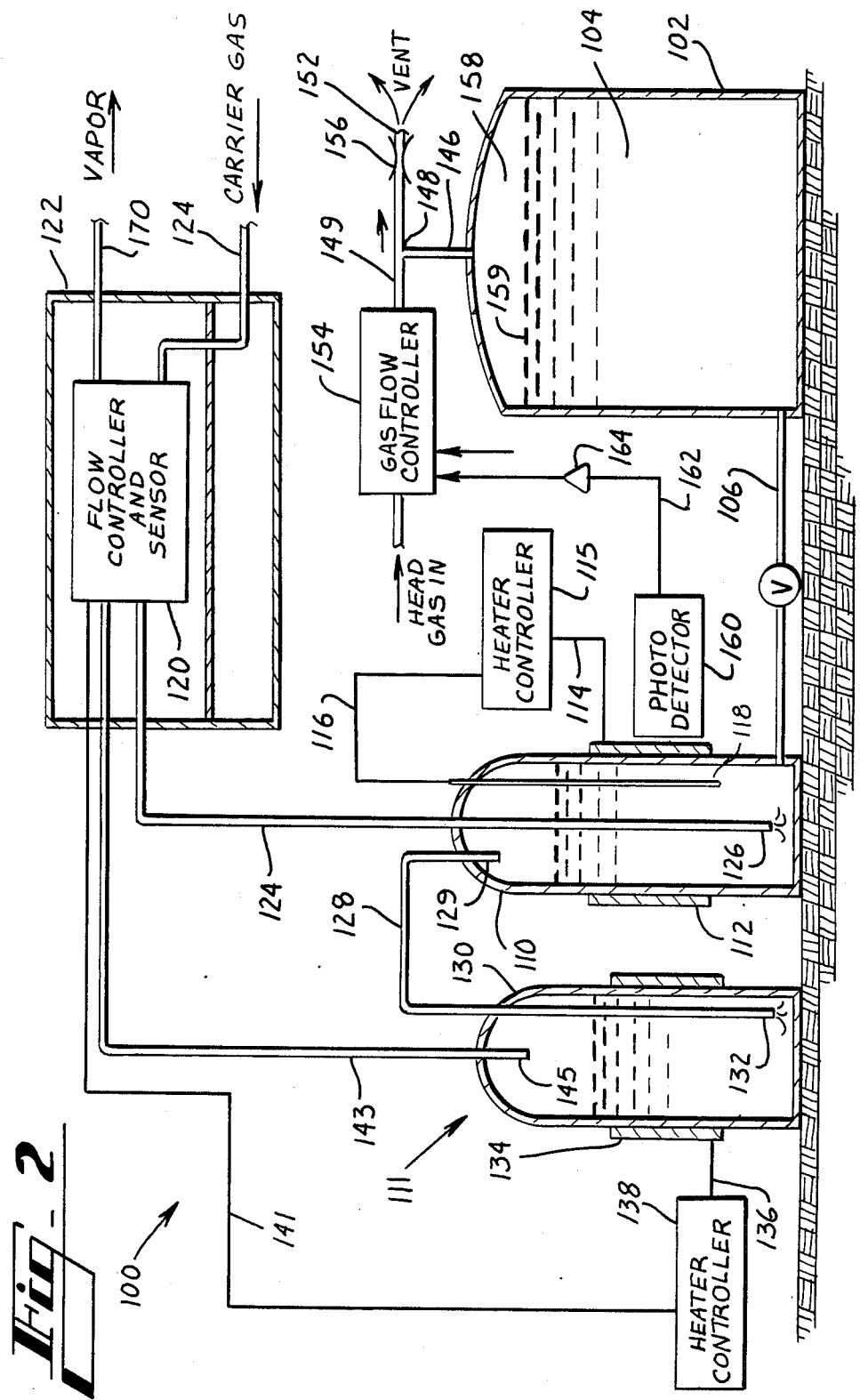

METHODS OF AND APPARATUS FOR VAPOR DELIVERY CONTROL IN OPTICAL PREFORM MANUFACTURE

TECHNICAL FIELD

This invention relates to methods of and apparatus for vapor delivery control. More particularly, it relates to the use of a dual bubbler arrangement for controlling the concentration level of vapor which is delivered to a deposition site where it is used in the manufacture of optical preforms from which lightguide fiber is drawn.

BACKGROUND OF THE INVENTION

The use of optical fiber communication systems has increased significantly during the last few years. It appears likely that the use of this mode of communications will continue to increase in the future. Companies engaged in the manufacture of components for these systems continue to seek ways to reduce the cost thereof and to handle efficiently materials invovled in the production thereof.

Presently, optical fibers are being manufactured in processes which include vapor deposition as a materials forming technique. This technique includes the reaction of a silicon-containing gas or vapor and the reaction of germanium-containing gas or vapor, for example, to form a deposited glass having suitable optical properties. These processes are used to manufacture preforms which is the first step in making lightguide fibers. One such process which is known as a modified chemical vapor deposition (hereinafter MCVD) process is described in J. B. MacChesney "Materials and Processes for Preform Fabrications -Modified Chemical Deposition", Vol. 64, proceedings of IEEE, pages 1181-1184 (1980).

Input to the MCVD process may comprise a carrier gas and reactant vapors such as germanium tetrachloride ($GECl_4$), silicon tetrachloride ($SiCl_4$), and phosphorous oxychloride ($POCl_3$). These reactant vapors are supplied from vaporizers commonly referred to as deposition bubblers and are passed to a deposition site such as a glass substrate tube. A preform from which optical fiber is drawn is manufactured by heating the substrate tube to a temperature in the range of 1600° to 1800° C. to react the vapors and deposit them in a predetermined manner within the substrate tube. In the manufacture of preforms, the reactant vapors must be blended precisely and delivered at controlled concentration levels to the substrate tube. This can be done by bubbling a carrier gas such as oxygen, for example, through heated supplies of the reactant materials in liquid form in bubblers and then to the deposition site with the vapors entrained in the carrier gases.

Typically, a deposition bubbler includes a container in which a carrier gas intake conduit terminates in an orifice located below the free surface of liquid contained therein. An outlet conduit provides fluid communication between the space above the surface of the liquid and the vapor deposition site. Exemplary of deposition systems employing bubblers is that illustrated in U.S. Pat. No. 3,826,560.

Inasmuch as vapor of the liquid contained within a deposition bubbler is withdrawn during deposition, the level of liquid drops unless the bubbler is replensished from an auxiliary source. In some applications, decreases in the level of liquid within the bubbler have little effect. In other applications, however, such as in vapor deposition processes employed in the manufacture of optical fiber preforms, variations in the liquid level may have an adverse effect such as changing the concentration level of the delivered vapor. This is attributable to the fact that the rate of vaporization is not solely dependent upon the surface area of liquid within the bubbler, which area can be maintained constant by the use of cylindrically shaped containers. The vaporization rate also is dependent upon several other factors including the flow characteristics of the carrier gas bubbled through the liquid. For example, the size of the bubbles, as they rise through the liquid, has an effect on the rate of vaporization. The rate of flow of the carrier gas introduced into the bubbler also affects the rate of vaporization, as does the residence time of the bubbles which, of course, depends on the depth at which the carrier gas is introduced. Another factor is the control of the heat transfer into the bubbler which is affected by significant changes in the quantity of liquid in the bubbler. Although it is possible to program a heater controller to account for some of these variables as changes in the level of liquid are continuously monitored, that approach is complex and does not satisfy completely the need for vapor delivery control in the bubbler.

The prior art includes U.S. Pat. No. 4,235,829 which issued on Nov. 25, 1980 to Fred P. Partus. In it, there is shown a vapor delivery system which comprises a deposition bubbler adapted to generate and to deliver vapor from a liquid contained therein and in a reservoir in fluid communication with the bubbler. Facilities are provided for sensing the level of the liquid contained within the bubbler and for providing gaseous head pressures in the reservoir of magnitudes dependent upon the sensed liquid level. The liquid level in the bubbler drops as liquid is vaporized and withdrawn from the bubbler whereupon the level is adjusted by increasing the pressure head in the reservoir to feed liquid to the bubbler. Unfortunately, perturbations in the deposition bubbler caused by a drop in liquid level and then a rise due to the changing of the pressure in the reservoir can affect adversely the rate of vaporization and hence the concentration level of the vapor. These level changes are exacerbated as the rate of deposition and hence the rate of withdrawal of vapor are increased. The prior art also includes closed systems in which, for example, one bubbler is positioned within another with both bubblers being depleted substantially sequentially.

Seemingly, the prior art does not include a satisfactory solution for the problem of controlling the liquid level in a deposition bubbler in order to control the delivery of vapor to a deposition site such as a substrate tube used in the manufacture of optical preforms. In order to provide quality preforms, the delivery arrangement must include provisions for preventing perturbations in the deposition bubbler. This requirement becomes important, particularly in view of the higher deposition rates toward which the industry appears to be moving.

SUMMARY OF THE INVENTION

The foregoing problem has been overcome by the methods and apparatus of this invention. A method is provided for controlling the delivery of vapor of a liquid from a deposition bubbler to a preform manufacturing apparatus to cause the vapor concentration level to be a predetermined value which may be substantially constant over a period of time. Included in the method is the step of providing a supply bubbler which contains a quantity of the liquid and which is in fluid communication with a quantity of liquid in the deposition bubbler. The liquid in the supply bubbler and in the deposition bubbler is heated to enhance the vaporization of liquid therein. A carrier gas is introduced into the supply bubbler, preferably below a free surface of the liquid therein, and then flowed from the supply bubbler into the deposition bubbler to cause vapor of the liquid to become entrained in the carrier gas and to flow from the supply bubbler into and from the deposition bubbler and to a deposition site. The method includes the step of maintaining sufficient liquid within the supply bubbler and suitable temperatures of the liquid in the supply and deposition bubblers to control the mass flow rate of the vapor into and out of the deposition bubbler. This prevents unintended perturbations in the deposition bubbler and causes the concentration level of the vapor entrained by the carrier gas and delivered from the deposition bubbler to have a predetermined value. The deposition bubbler may be controlled to adjust the concentration level of the vapor to cause the vapor concentration at the deposition site to be the predetermined value. In one embodiment, the method includes sensing the ratio of vapor to carrier gas being delivered from the deposition bubbler in the vapor stream and applying heat to the liquid within the deposition bubbler at a rate in direct relationship to the sensed ratio. The liquid in the supply bubbler may be replenished between the manufacture of successive preforms, or relatively small deviations of the liquid level in the supply bubbler from a predetermined level may be sensed and, in response thereto, flow of liquid between a reservoir and the supply bubbler may be caused.

In a vapor delivery system, a deposition bubbler is adapted to generate and to deliver vapor from a liquid contained therein. A reservoir of the liquid is in fluid communication with a supply bubbler which is interposed between the reservoir and the deposition bubbler. Facilities are provided for injecting a carrier gas into the liquid in the supply bubbler below a free surface thereof and for heating the liquid in the supply bubbler and in the deposition bubbler to cause vapor entrained in the carrier gas to be flowed from the supply bubbler into and out of the deposition bubbler and to a deposition site. A quantity of liquid is maintained in the supply bubbler which is sufficient along with suitable temperatures of the liquid in the supply and deposition bubblers to prevent unintended perturbations in the deposition bubbler and cause the concentration level of the vapor entrained in the carrier gas and delivered from the deposition bubbler to have a predetermined value. Inasmuch as the difference between the mass flow rate of the vapor into and out of the deposition bubbler may be controlled to be relatively small, the liquid level in the deposition bubbler may be maintained almost constant. The system also may comprise facilities for providing a gaseous head pressure in the reservoir to allow refilling of the supply bubbler. Further, the delivery system may include provisions for sensing the level of the liquid contained within the supply bubbler and provisions responsive to relatively small deviations from a predetermined level for causing flow between the reservoir and the supply bubbler. This causes the liquid in the supply bubbler to return to at least the predetermined level which corresponds to a sufficient quantity of liquid to enable control of the vapor entrainment in the supply and deposition bubblers.

BRIEF DESCRIPTION OF THE DRAWINGS

Other features of the present invention will be more readily understood from the following detailed description of specific embodiments thereof when read in conjunction with the accompanying drawings, in which:

FIG. 1 is a schematic diagram of a preferred embodiment of a vapor delivery system embodying the principles of this invention; and FIG. 2 is a schematic diagram of an alternative embodiment of a vapor delivery system.

DETAILED DESCRIPTION

Referring now to FIG. 1, there is shown a preferred embodiment of a vapor delivery system 20 for use in manufacturing an optical preform from which lightguide fiber is drawn. The system 20 is designed to provide a vapor stream of an easily vaporizable liquid 22 which is contained in a reservoir 24 and in a bubbler system 26. The reservoir 24 may be a shipping container which need not be connected permanently to the system 20. A carrier gas such as oxygen, for example, is bubbled through the liquid in the bubbler system 26 to cause the gas to be entrained with a vapor of the material of the liquid and fed through a flow controller and sensor unit 28 to a vapor deposition site such as a lathe (not shown) of an MCVD system. See for example U.S. Pat. No. 4,217,027 which issued on Aug. 12, 1980 in the names of J. B. MacChesney et al.

The system 20 includes a conduit 32 which provides fluid communication between the reservoir 24 and the bubbler system 26. A valve 33 is inserted into the conduit 32 between the reservoir 24 and a manifold 35 which is connected to the supply system 26. The reservoir 24 is dimensioned to have a capacity several orders of magnitude greater than that of the bubbler system. The reservoir 24, the bubbler system 26 and the conduit 32 are constructed of a material such as glass, for example. A gas intake line 34 extends upwardly from the top of the reservoir through a valve and pressure pressure regulator 36 to a source (not shown) of compressed gas which may be the same as the carrier gas. The pressure of the gas is adjusted to maintain a reservoir head pressure.

The bubbler system 26 includes a supply bubbler 40 having a heater 42 which, for example, may be a strap heater that is jacketed about an outer surface of the bubbler. The heater 42 is used to provide heat energy to increase the temperature of and to vaporize the liquid in the supply bubbler 40. As seen in FIG. 1, the heater 42 is connected along a signal line 44 through a heater controller 45 to a temperature sensor 46 which extends into the supply bubbler.

A carrier gas intake conduit 48 extends from an unshown source of pressurized gas into a temperature controlled chamber 50 and through the flow controller and sensor unit 28 therein. The flow controller and sensor unit 28 includes a flow rate sensor for the carrier gas. See U.S. Pat. No. 4,276,243 which issued on June 30, 1981 in the name of F. P. Partus and which is incorporated by reference hereinto. One commercially available flow rate sensor utilizes the principle that the temperature rise of a gas at a relatively constant pressure is a function of the amount of heat added, the mass flow rate and other properties of the gas. Constant power is supplied to the sensor unit which experiences a change in resistance when gas is flowed therethrough. An upstream sensor is cooled at a higher rate than a downstream sensor, providing a bridge imbalance. The bridge output then can be calibrated with actual gas flows that are monitored. After passing through the unit 28, the conduit is directed downwardly out of the chamber 50 and into the supply bubbler 40 terminating in a lower inlet 54, preferably adjacent to the bottom of the supply bubbler. The inlet 54 may comprise an apertured glass member which is effective to generate relatively small bubbles to enhance the bubbling of the carrier gas.

A vapor stream conduit 56 extends upwardly from an intake orifice 58 located adjacent to the top of the supply bubbler 40 into another bubbler 60 which is referred to as the deposition bubbler and which is smaller than the supply bubbler. The conduit 56 terminates in an outlet 62 adjacent to the bottom of the deposition bubbler. The deposition bubbler 60 is provided with facilities for heating the liquid to increase its temperature and to enhance the vaporization of the liquid therein. For example, it may be jacketed with a resistance heater 63 which is connected through a line 64 and a heater controller 65 to a temperature sensor 66.

Through the top of the deposition bubbler 60 extends a vapor stream conduit 67. It extends from an intake 68 along a line 70 past the chamber 50 where it joins other unshown vapor stream conduits from other bubblers of a similar type and then to a vapor deposition site.

In operation, a liquid shipping container which may serve as the reservoir 24 is connected to the line 32 with the valve 33 being in the off position. The supply and deposition bubblers 40 and 60 are filled individually to predetermined levels by opening the valve 33, and opening and closing the valve 74, and then opening the valve 72. Afterwards, the valve 33 is closed. Then the valve 36 is opened to cause the pressurized gas to enter the reservoir 24.

The heaters 42 and 63 are controlled to increase the temperature of the liquid in the supply and deposition bubblers 40 and 60, respectively, to vaporize liquid therein. In the embodiment shown in FIG. 1, which is characterized as being temperature controlled, signals corresponding to the temperatures sensed by the sensors 46 and 66 are provided to input terminals of the heater controllers 45 and 65, respectively. The heater controllers are conventional power controllers such as, for example, a 3-mode power controller sold by Research, Inc. as Model No. 639B. Each controller compares the input signal with a preselected temperature set point and in response thereto controls the current flow to one of the bubbler heaters.

The carrier gas is flowed into the flow controller and sensor unit 28. The signal from the carrier gas flow rate sensor (not shown) of the flow controller and sensor unit 28 is compared to a set point. An output signal is amplified and directed to a valve (not shown) positioned within the the input conduit 48 to control the flow of the carrier gas.

The carrier gas is introduced along the conduit 48 into the supply bubbler 40 below a free surface thereof to cause vapor of the liquid to become entrained in the carrier gas. Then the vapor entrained carrier gas is flowed from the supply bubbler along the conduit 56 into the liquid in the deposition bubbler and out of the deposition bubbler to the deposition site. Introduction of the carrier gas into the liquid in the supply bubbler 40 and the deposition bubbler 60 causes bubbles to form and to rise to the liquid surface. Vapor diffuses into the bubbles and occupies the space above the free surface of the liquid. Vaporization also occurs at the surface of the liquid. Accordingly, the bubbles pick up vapor as they rise in the liquid and as they pass through the space in each bubbler above the free surface.

The rate of vaporization may be affected by the temperature of the liquid, the size of the bubbles and the residence time of the bubbles in the liquid. The quantity of liquid in the supply bubbler 40 is sufficient to enable suitable temperature control such that the carrier gas is partially saturated with vapor as it leaves the supply bubbler. The quantity of liquid and temperature are maintained generally to cause the vapor in the outflow from the supply bubbler preferably to be about 90 to 95% of the total amount of vapor which is entrained in the carrier gas and flowed out of the deposition bubbler to the deposition site.

In the deposition bubbler 60, the heat energy imparted to the liquid causes the vapor content of the outflow through the intake 68 to be incrementally greater than that of the vapor inflow. This incremental amount may be on the order of 5 to 10% of what is required at the deposition site. Inasmuch as the difference between the outflow and inflow of vapor in the deposition bubbler is relatively small, it is easier to control and allow the use of the temperature sensor 66.

The use of two bubblers allows one, the supply bubbler, to provide to the deposition bubbler a gross contribution to the vapor flow, whereas the second, the deposition bubbler, is used to trim or fine tune the amount of vapor. This capability of adjusting the vapor to cause the outflow from the deposition bubbler to be incrementally increased over the inflow results in accurate control of the concentration level of the vapor. Further, because of the relatively small net outflow of vapor, that is the outflow less the inflow, provided by the liquid in the deposition bubbler, the level of the liquid in that bubbler during a preform run drops only slightly and for feedback purposes remains substantially constant. As a result, unintended perturbations within the deposition bubbler are prevented and adverse effects on feedback are minimized.

The liquid level in the supply bubbler 40 is at least a predetermined level such that the quantity of liquid in the supply bubbler is sufficient to enable temperature control over the liquid therein which is suitable for the control of the mass flow rate of vapor into and out of the deposition bubbler. Mass flow rate in units of grams per minute, for example, is the product of the concentration in grams per cubic centimeter and the volumetric flow in cubic centimeters per minute. With the mass flow rate of vapor into the deposition bubbler being only slightly less than the mass flow rate of vapor therefrom in the preferred embodiment, the liquid level in the deposition bubbler is maintained almost constant. If the level of the liquid in the supply bubbler is so low that the heater 42 is not effective to provide suitable temperature control of the liquid therein, a greater imbalance of the mass flow rates into and out of the deposition bubbler occurs. Inasmuch as less vapor is being entrained in the supply bubbler, the net vapor outflow from the deposition bubbler increases, perhaps substantially. As a result of these perturbations in the deposition bubbler, the concentration level of the delivered vapor changes thereby affecting adversely the deposition in the optical preform.

The minimum quantity of liquid provided in the supply bubbler 40 is the minimum quantity which maintains at least a predetermined level which is sufficient to allow substantial vapor entrainment to occur in the supply bubbler 40. If the quantity of liquid is too little, the level of the liquid in the supply bubbler will be so low that the amount of vapor entrained in the supply bubbler drops to below an acceptable range. As a result, a substantial amount of makeup liquid must be flowed into the supply bubbler 40 thereby requiring a substantial increase in heat energy input. During this time, the heater 63 would have to provide substantially more heat energy to cause the deposition bubbler to make up the shortfall from the supply bubbler. After the heat energy has been adjusted in the supply bubbler 40, the amount of vapor entrained therein may exceed the predetermined concentration level before the heat energy is adjusted downwardly. Because the deposition bubbler may have no cooling facilities, this condition may cause the vapor outflowed to the deposition site to have too high a concentration level. However, by controlling the quantity of liquid in the supply bubbler 40, the system 20 is capable of preventing unintended changes in the concentration level which are associated with wide swings in the liquid levels.

Preferably, the temperature of the liquid in the deposition bubbler 60 is suitable to insure that the carrier gas picks up additional vapor in the deposition bubbler. This is accomplished by controlling the relative values of heat energy provided to the liquid in the deposition bubbler 60 and in the supply bubbler 40. If the temperature of the liquid in the supply bubbler 40 is substantially greater than that of the liquid in the deposition bubbler 60, the outflow of the vapor from the deposition bubbler is less than the inflow and the liquid level therein increases. This would cause unintended excursions of the temperature control feedback system in the deposition bubbler. If the temperature of the liquid in the deposition bubbler 60 is greater than that of the liquid in the supply bubbler 40, the mass flow into the deposition bubbler is less than the mass flow therefrom and the liquid level in the deposition bubbler decreases slightly. In the preferred embodiment, the temperature of the liquid in the deposition bubbler 60 is slightly more than that of the liquid in the supply bubbler 40.

Advantageously, presently used shipping containers of the liquids used in the vapor deposition process are sufficiently large so that they can be used to fill the supply bubbler on a plurality of occasions with liquid sufficient for a preform run. As a result, once the supply bubbler is filled and the valve 33 is closed, operation continues for the preform run and there is no need to reopen the valve. Furthermore, the shipping container can be disconnected from the bubbler system at the valve 33 and used to fill other bubbler systems. The broken line 75 in FIG. 1 is used to indicate that the reservoir 24 need not be a permanent part of the system 20.

For even closer control of the quantity of liquid in the supply bubbler 40, the system 20 may include a feedback loop which includes the valve 33 and a pair of detectors 76 and 78 such as photodetectors, for example, that are mounted adjacent to the exterior of the supply bubbler. See priorly identified U.S. Pat. No. 4,235,829 which is incorporated by reference hereinto. As the level of the liquid in the supply bubbler 40 drops, it may reach a level which is aligned with the detector 78 at a predetermined minimum level for the supply bubbler.

An electrical signal generated by either detector is functionally related to the level of the liquid in the supply bubbler 40. Should the level of the liquid in the supply bubbler 40 drop below the detector 78, a signal is provided to the valve 33 which is energized to be opened to allow the liquid 22 in the reservoir under a pressure head to be moved through the open valve 72 into the supply bubbler. When the liquid level in the supply bubbler 40 rises to the level of the detector 76, another signal is provided to the valve 33 to cause it to be closed thereby discontinuing liquid flow into the supply bubbler.

The detectors 76 and 78 are positioned so that makeup liquid from the reservoir 24 is added when the quantity of liquid in the supply bubbler 40 decreases by only a relatively small amount. Should large amounts of makeup liquid be added, the amount of vapor entrained from the relatively cooler liquid decreases temporarily. Inasmuch as the heater controller 65 is controlled from the sensor 66 and a set point, the deposition bubbler 60 temporarily does not cause sufficient additional vapor to be entrained to maintain a substantially constant concentration level. Furthermore, once the heater controller 45 reacts to the body of cooler liquid in the supply bubbler 40, overcompensation may occur, causing too much vapor to be entrained in the supply bubbler and flowed to the deposition bubbler. Because the deposition bubbler may have no facilities for cooling the vapor-entrained gas received, the concentration level of the outflow therefrom may be too high.

Another embodiment of the invention is shown in FIG. 2 and is designated as a system 100. The system 100 includes a reservoir 102 which contains a liquid 104 and which is in fluid communication along a valved line 106 with a supply bubbler 110 of a bubbler system 111. It should be apparent that the reservoir 102 of FIG. 2 may be a shipping container and that the manifold arrangement of FIG. 1 could be used. The supply bubbler 110 includes a heater 112 which may be one that is jacketed about an outer surface thereof. The heater 112 is connected along a signal line 114 through a heater controller 115 and line 116 to a temperature sensor 118 within the supply bubbler 110.

A carrier gas intake conduit 124 extends from an unshown source of pressurized gas into a temperature controlled enclosure 122 and through a flow controller and sensor unit 120. The unit 120 not only includes a flow rate sensor (not shown) for controlling the inflow of the carrier gas, but also includes a vapor-to-carrier gas ratio sensor (not shown) which employs sensor elements that are exposed to the flow of both the input carrier gas and to the vapor stream from the bubbler system 111. See priorly identified U.S. Pat. No. 4,276,243.

After passing through the unit 120, the conduit 124 is directed downwardly out of the enclosure 122 and into the supply bubbler 110 terminating with a lower outlet or orifice 126 located preferably adjacent to the bottom of the bubbler. A vapor stream conduit 128 extends upwardly from an intake orifice 129 in the supply bubbler 110 into the top of a deposition bubbler 130 and terminates in an orifice 132 preferably below the free surface of the liquid therein.

The deposition bubbler 130, which normally is smaller than the supply bubbler 110, includes a strap heater 134, for example, which is jacketed about its outer surface and which is connected through a load line 136 to a heater controller 138. The heater controller 138 is coupled through a signal line 141 to the flow controller and sensor unit 120. A vapor stream conduit 143 extends from an intake orifice 145 inside the deposition bubbler 130 into the temperature controlled enclosure 122 and through the flow controller and sensor unit 120 where it joins with other, unshown vapor steam conduits from other bubblers and then out of the enclosure to a vapor deposition site. As should be apparent, the flow controller and sensor unit is coupled electrically to the heater controller 138.

Returning to the reservoir 102, it can be seen that a gas line 146 extends upwardly from the top of the reservoir to a junction 148 with another gas line 149. The gas line 149 itself extends from an unshown supply of pressurized gas, which may be the same as that of the carrier gas, to a vent 152 through a gas flow controller 154. The gas flow controller 154, which may be a Fluid Controller Model No. 260 sold by the Tylan Corporation of Torrance, Calif., serves to regulate the flow rate of gas through the conduit 149. A choke 156 is located between the juncture of the lines 146 and 149 and the vent 152. With this arrangement, a head pressure is established in a space 158 within the reservoir above a free surface 159 of liquid housed therein which may be altered by the gas flow controller 154.

A detector 160 such as a photodetector, for example, is mounted adjacent the exterior of the supply bubbler 110 at a predetermined minimum level selected for liquid contained within the supply bubbler. The level is predetermined as in the preferred embodiment to cause the quantity of liquid in the supply bubbler 110 to be sufficient to cause the vapor entrained in the supply bubbler to be a substantial percentage of the total amount of vapor flowed from the deposition bubbler 130. As described hereinbefore for the embodiment shown in FIG. 1, the electrical signal generated by the detector 160 is functionally related to the level of the liquid. This signal is fed through a control signal line 162 and an amplifier 164 to the gas flow controller 154 and compared to a set point. Should the liquid level in the supply bubbler be too low, the controller 154 causes sufficient pressurized gas to flow into the reservoir 102 to cause portions of the liquid 104 to be flowed into the supply bubbler 110. In this manner, the flow of gas through the conduit 149 and the magnitude of the head pressure within space 158 of the reservoir are functionally related to the actual level of the liquid within the bubbler 110 as sensed by the detector. The level of the liquid in the bubbler 110 is caused to remain substantially at or above the level aligned with the detector 160 by increasing the reservoir head pressure as vapor of the liquid in the supply bubbler is flowed over to the deposition bubbler 130. As in the embodiment shown in FIG. 1, the quantity of liquid in the supply bubbler 110 is allowed to decrease by only a relatively small amount before makeup liquid from the reservoir 102 is added.

In operation, the reservoir 102 and the deposition bubbler 130 are partially filled with liquid which is to be deposited by vapor deposition at an unshown vapor deposition station such as where an optical preform or rod is to be manufactured. The liquid flows from the reservoir 102 through the conduit 106 into the supply bubbler 110 until the surface level of the liquid in the bubbler equals that of the surface level of the liquid within the reservoir. A pressurized gas is then introduced into the reservoir 102 through the conduit 146 and the pressure set to establish a preselected level for the surface of the liquid within the bubbler. The pressure is then maintained constant within the reservoir until the level in the supply bubbler drops below a preselected level. In the alternative, the pressure head in the reservoir 102 is proportional to the liquid level in the supply bubbler 110.

As in the preferred embodiment, the heaters 112 and 134 cause the temperature of the liquid within the supply and deposition bubblers 110 and 130, respectively, to be increased to vaporize liquid therein. The carrier gas is introduced through the flow controller, into the supply bubbler 110 and bubbled up through the liquid to entrain vapor.

The carrier gas transports vapor out of the supply bubbler 110 along the conduit 128 into the deposition bubbler 130 wherein bubbling also occurs. Then the vapor entrained carrier gas is flowed from the deposition bubbler 130 through the inlet orifice 145 and the conduit 143 to the ratio sensor 120 and out through a conduit 170 to an unshown manifold where it is mixed with gases and other vapors from other bubblers of the same type.

When lowering of the liquid level in the supply bubbler 110 occurs, and when it reaches the level of the detector 160, the level is adjusted by increasing the pressure head in the reservoir 102. As will be recalled, if makeup liquid is to be added during a preform run, then the detector 160 is positioned to cause makeup to be added when the quantity of liquid in the supply bubbler decreases by a relatively small amount. In the alternative, the amount of liquid in the supply bubbler 110 could be set sufficiently high so that makeup liquid need not be added during a preform run.

As will be recalled, in prior art arrangements, techniques were used to insure that once the level in the deposition bubbler begins to drop, additional liquid is flowed into the deposition bubbler. However, any change in level, albeit very small, changes the feedback response of the system because a drop in level changes the volume within the bubbler. The flow controller and sensor unit 120 is set with constants as described in previously mentioned U.S. Pat. No. 4,276,243. These constants are set to cover a range of conditions. If the liquid level in the deposition bubbler is maintained substantially constant, the controller functions more accurately.

As the vapor stream passes over the vapor-to-carrier gas ratio sensor in the flow controller and sensor unit 120, the ratio of vapor to carrier gas being delivered to the vapor deposition station is determined. A corresponding signal is transmitted from the sensor circuit over the line 141 to the heater controller 138. At the heater controller 138, this input signal is compared with a set point. If the sensed ratio is found to be too low, the heater controller 138 increases the current delivered over the load line 136 to the heater 134, thereby causing a higher rate of heat energy to be provided to the liquid housed within the deposition bubbler. Conversely, if the ratio of the vapor-to-carrier gas is found to be too high, the heater controller decreases the flow of the current to the heater.

As the sensor circuit and the heater controller 138 cooperate in controlling the heater 134, the carrier gas flow rate sensor circuit simultaneously controls the flow rate of the carrier gas input to the supply bubbler 110. Signals from the ratio sensor circuit are combined with those of the flow rate sensor circuit and compared to a control set point for vapor mass flow rate. Small deviations are trimmed by automatically making slight adjustments to the carrier gas flow as a means for controlling the mass flow rate. It is the heater circuit, however, which holds the vapor-to-carrier gas ratio substantially constant.

One of the advantages of the system 100 or 20 relates to back pressure. If a change in back pressure develops while bubbling occurs in the system, the liquid in the deposition bubbler is not depleted. Of course, in the event that the bubbling has been discontinued, some liquid could rise in the conduit 128 leading back to the supply bubbler 110. In prior art systems, back pressure caused the liquid to return to the reservoir. Of course in the system 100 or in the system 20, the liquid could be moved intentionally to the reservoir to drain the bubblers if there are contaminants present.

It is to be understood that the above-described arrangements are simply illustrative of the invention. Other arrangements may be devised by those skilled in the art which will embody the principles of the invention and fall within the spirit and scope thereof.

What is claimed is:

1. A method of controlling the delivery of vapor of a liquid to a vapor deposition site, said method including the steps of:
   providing a deposition bubbler which contains a quantity of the liquid and which is in fluid communication with the deposition site;
   providing a supply bubbler which contains a quantity of the liquid and which is in fluid communication with the deposition bubbler;
   heating the liquid in the supply bubbler and in the deposition bubbler to vaporize liquid therein;
   introducing a gaseous medium into the supply bubbler and then flowing the gaseous medium from the supply bubbler into the deposition bubbler to cause vapor of the liquid to become entrained in the gaseous medium and to flow from the supply bubbler into the deposition bubbler and from the deposition bubbler to the deposition site; and
   maintaining sufficient liquid within the supply bubbler and suitable temperatures of the liquid in the supply and in the deposition bubblers to control the mass flow rate of vapor into and out of the deposition bubbler to prevent unintended perturbations in the deposition bubbler and cause the concentration level of the delivered vapor which is entrained in the gaseous medium to have a predetermined value.

2. The method of claim 1, wherein said step of maintaining is accomplished to cause the concentration level of the delivered vapor to be substantially constant.

3. The method of claim 1, wherein said step of heating is accomplished to cause the temperature of the liquid in the deposition bubbler to be greater than that of the liquid in the supply bubbler.

4. The method of claim 1, wherein a ratio of vapor to gaseous medium is detected by sensing a heat transfer characteristic of the vapor flow from the deposition bubbler and the heating of the liquid in the deposition bubbler is accomplished in response to the sensed ratio.

5. The method of claim 1, wherein said method also includes the step of providing a reservoir of the liquid and a conduit which includes a valve and which provides communication between the reservoir and the supply bubbler, and said step of maintaining is accomplished by providing a gaseous head pressure within the reservoir and opening the valve to allow filling of the supply bubbler with liquid.

6. The method of claim 5, wherein levels of the liquid in the supply bubbler between limits which define a sufficient quantity of liquid are established, and wherein when the liquid level rises or drops to those levels, the valve is closed or opened to discontinue or to begin filling of the supply bubbler.

7. The method of claim 1, which also includes;
   providing a reservoir of the liquid which is in liquid communication with the supply bubbler;
   sensing deviations of the liquid level within the supply bubbler from a predetermined level; and
   in response to the sensed deviations of the liquid level from the predetermined level, causing a flow of the liquid between the reservoir and the supply bubbler to cause the liquid level to be restored to a level which is sufficient to enable suitable temperature control of the liquid within the supply bubbler to prevent unintended perturbations in the deposition bubbler and cause the concentration level of the delivered vapor to be substantially constant.

8. The method of claim 7, which also includes providing a valved conduit which communicates the reservoir with the supply bubbler, and wherein the step of causing is accomplished by providing a gaseous head pressure within the reservoir and by varying the gaseous head pressure within the reservoir and opening the valve to maintain the liquid level in the supply bubbler at least at the predetermined level by causing liquid to flowed from the bubbler to the reservoir.

9. The method of claim 1, wherein said step of maintaining causes the mass flow rate of the vapor from the deposition bubbler to be slightly greater than the mass flow rate thereinto.

10. An apparatus for controlling the delivery of vapor to a deposition site, said apparatus comprising:
    a deposition bubbler which contains a quantity of a liquid and which is in fluid communication with the deposition site;
    a supply bubbler which contains a quantity of the liquid and which is in fluid communication with the deposition bubbler;
    heating means for increasing the temperature of the liquid in the supply bubbler and in the deposition bubbler to vaporize liquid therein;
    means for introducing a carrier gas into the supply bubbler and for flowing the gas from the supply bubbler into the deposition bubbler to cause vapor of the liquid to become entrained in the carrier gas and to flow from the supply bubbler into the deposition bubbler and out of the deposition bubbler to the deposition site; and
    control means for maintaining sufficient liquid within said supply bubbler and suitable relative temperatures of the liquid in said supply bubbler and of the liquid in said deposition bubbler to control the vapor mass flow rate into and out of the deposition bubbler to prevent unintended perturbations in the deposition bubbler and cause the concentration level of the delivered vapor which is entrained in the carrier gas to be a predetermined value.

11. The apparatus of claim 10, wherein said control means causes the concentration level of the delivered vapor to be substantially constant.

12. The apparatus of claim 10, wherein said heating means causes the temperature of the liquid in said deposition bubbler to be higher than that of the liquid in said supply bubbler.

13. The apparatus of claim 10, wherein the ratio of vapor-to-carrier gas is detected by sensing a heat transfer characteristic of the vapor flowed out of said deposition bubbler and said means for heating said deposition bubbler is controlled in response to the sensed ratio.

14. The apparatus of claim 10, which also includes a reservoir for holding a quantity of the liquid and a conduit which includes a valve and which provides liquid communication between said reservoir and said supply bubbler, and wherein said control means includes means for providing a gaseous head pressure within said reservoir.

15. The apparatus of claim 14, wherein levels of the liquid in said supply bubbler between limits which define a sufficient quantity of liquid are established, and wherein when the liquid level rises or drops to those levels, said valve is closed or opened automatically to discontinue or to begin filling said supply bubbler.

16. The apparatus of claim 10, which also includes:

a reservoir which contains a liquid;

means for sensing the level of liquid in said supply bubbler;

conduit means for providing liquid communication between said reservoir and said supply bubbler; and means including means for providing a gaseous head pressure in said reservoir and being responsive to the sensed level of liquid in said supply bubbler for varying the head pressure to cause flow between said reservoir and said supply bubbler to bring the level of the liquid therein to at least a level which is predetermined to be sufficient to enable suitable temperature control of the liquid in the supply bubbler to prevent the unintended perturbations in the deposition bubbler.

* * * * *

UNITED STATES PATENT AND TRADEMARK OFFICE
CERTIFICATE OF CORRECTION

PATENT NO. : 4,582,480
DATED : April 15, 1986
INVENTOR(S) : B. Lynch, P. L. Narasimham, F. P. Partus It is certified that error appears in the above-identified patent and that said Letters Patent are hereby corrected as shown below:

In the claims, Column 12, claim 8, line 26 and 27, "to flowed" should read --to be flowed--. Column 12, claim 10, line 47, "to flow" should read --to be flowed--. Column 13, claim 13, line 1, "said means" should read --said heating means--. Column 13, claim 13, lines 1 and 2 "for heating said deposition bubbler" should be deleted.

In Column 1, line 65, "replensished" should read --replenished--.

Signed and Sealed this

Thirtieth Day of December, 1986

*Attest:*

DONALD J. QUIGG

*Attesting Officer*   *Commissioner of Patents and Trademarks*